(12) United States Patent
Lee et al.

(10) Patent No.: US 9,397,074 B1
(45) Date of Patent: Jul. 19, 2016

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wei-Hsuan Lee, Kaohsiung (TW); Sung-Mao Li, Kaohsiung (TW); Chien-Yeh Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 14/700,079

(22) Filed: Apr. 29, 2015

(51) Int. Cl.
 *H01L 23/48* (2006.01)
 *H01L 25/065* (2006.01)
 *H01L 23/498* (2006.01)
 *H01L 23/31* (2006.01)
 *H01L 21/48* (2006.01)
 *H01L 21/56* (2006.01)

(52) U.S. Cl.
 CPC .......... *H01L 25/0657* (2013.01); *H01L 21/486* (2013.01); *H01L 21/4853* (2013.01); *H01L 21/56* (2013.01); *H01L 23/3157* (2013.01); *H01L 23/49811* (2013.01); *H01L 23/49827* (2013.01); *H01L 23/49838* (2013.01); *H01L 2225/06517* (2013.01); *H01L 2225/06544* (2013.01)

(58) Field of Classification Search
 CPC ....................... H01L 21/67121; H01L 23/3114
 USPC ......................................................... 257/737
 See application file for complete search history.

(56) References Cited

U.S. PATENT DOCUMENTS

| | | | |
|---|---|---|---|
| 8,304,900 | B2 | 11/2012 | Jang et al. |
| 8,354,301 | B2 | 1/2013 | Roberts et al. |
| 2012/0038040 | A1* | 2/2012 | Jang et al. ........... H01L 23/3128 257/737 |

* cited by examiner

*Primary Examiner* — Elias M Ullah
(74) *Attorney, Agent, or Firm* — Foley & Lardner LLP; Cliff Z. Liu; Angela D. Murch

(57) ABSTRACT

A semiconductor package includes a substrate, a set of electrical components, a stud, a tapering electrical interconnection and a package body. The electrical components are disposed on a top surface of the substrate. A bottom surface of the stud is disposed on the top surface of the substrate. A bottom surface of the electrical interconnection is disposed at a top surface of the stud. A width of the stud is greater than or equal to a width of the bottom surface of the electrical interconnection. The package body is disposed on the top surface of the substrate, and encapsulates the electrical components, the stud and a portion of the electrical interconnection. The package body exposes a top surface of the electrical interconnection.

14 Claims, 7 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package with a vertical interconnection structure and a manufacturing method thereof.

2. Description of the Related Art

Semiconductor devices have become progressively more complex, driven at least in part by the demand for smaller sizes and enhanced processing speeds. At the same time, there is a demand to further miniaturize many electronic products containing these semiconductor devices. New techniques for miniaturization are correspondingly desirable.

SUMMARY

In accordance with an embodiment of the present disclosure, a semiconductor device package includes a substrate, a set of electrical components, one or more studs, a tapering electrical interconnection and a package body. The substrate has a top surface. The electrical components are disposed on the top surface of the substrate. The stud has a top surface and a bottom surface. The bottom surface of the stud is disposed on the top surface of the substrate. The electrical interconnection has a top surface and a bottom surface. The bottom surface of the electrical interconnection is disposed at the top surface of the stud. A width of the stud is greater than or equal to a width of the bottom surface of the electrical interconnection. The package body is disposed on the top surface of the substrate, and encapsulates the electrical components, the stud and a portion of the electrical interconnection. The package body exposes the top surface of the electrical interconnection.

In accordance with an embodiment of the present disclosure, a semiconductor device package includes a substrate, a stud-section, an electrical interconnection and a package body. The substrate has a top surface. The stud-section has a top surface and a bottom surface. The bottom surface of the stud-section is disposed on the top surface of the substrate. The electrical interconnection has a top surface and a bottom surface. The electrical interconnection tapers from its top surface to its bottom surface. The bottom surface of the electrical interconnection is disposed at the top surface of the stud-section. A height of the electrical interconnection is equal to or greater than a height of the stud-section. The package body is disposed on the top surface of the substrate, and covers the stud-section and a portion of the electrical interconnection. The package body exposes the top surface of the electrical interconnection.

In accordance with an embodiment of the present disclosure, a method of manufacturing a semiconductor device package includes providing a substrate; attaching a set of electrical components on the substrate; forming a stud-section on the substrate; forming a package body on the substrate to encapsulate the electrical components and the stud; forming a tapering cavity from a top surface of the package body to expose a top surface of the stud-section, where a depth of the cavity is equal to or greater than a height of the stud-section; and filling the cavity with an electrically conductive material to form an electrical interconnection.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

A stacked semiconductor device package is proposed to reduce a size of the semiconductor device package, and to provide for more flexible semiconductor device package design. A vertical interconnection structure according to this disclosure occupies a relatively small space within the stacked semiconductor device package, providing for relatively dense interconnections. The vertical interconnection structure according to this disclosure further provides for vertical interconnections spanning a relatively large distance.

Figure 1A:
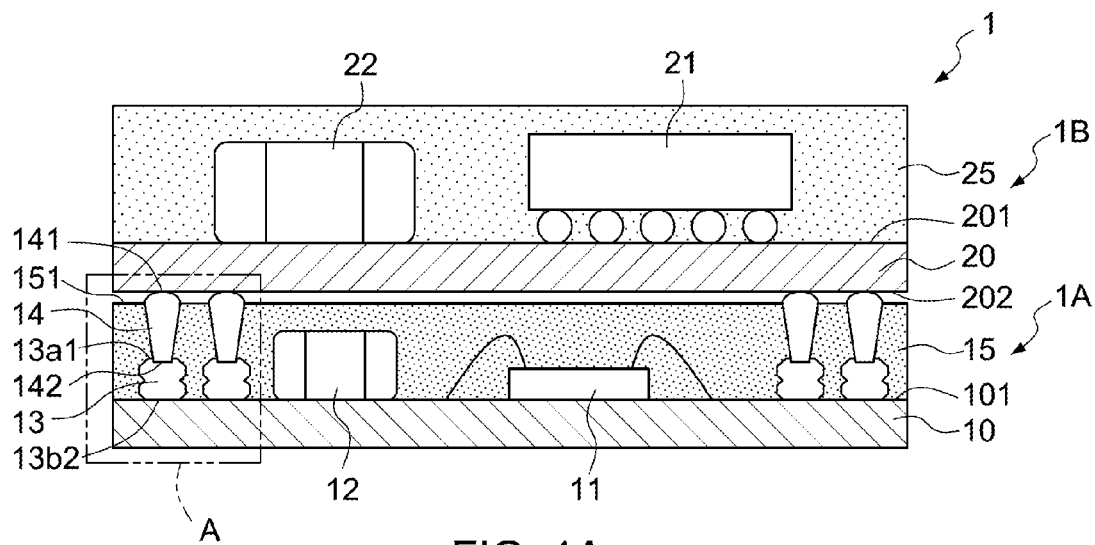
FIG. 1A illustrates a semiconductor device package in accordance with an embodiment of the present disclosure.

FIG. 1A illustrates a cross-sectional view of a semiconductor device package 1 in accordance with an embodiment of the present disclosure. The semiconductor device package 1 includes a first module 1A and a second module 1B stacked on the first module 1A.

The first module 1A includes a substrate 10, a set of electrical components 11, 12, a stud-section 13, an electrical interconnection 14 and a package body 15.

The substrate 10 is formed of, for example, a printed circuit board, such as a paper-based copper foil laminate, a composite copper foil laminate, or a polymer-impregnated glass-fiber-based copper foil laminate. The substrate 10 may include a redistribution layer (RDL) or traces; for example, for electrical connection between components (e.g., the electrical components 11, 12) mounted on a top surface 101 of the substrate 10, or for electrical connection between components and the stud-section 13, or for electrical connection between components or the stud-section 13 on the top surface 101 of the substrate 10 and electrical terminals (not shown) on a bottom surface of the substrate 10.

The electrical component 11 is disposed on (e.g., directly on and in contact with, or indirectly on or over and with one or more possible intervening components) the top surface 101 of the substrate 10. In one or more embodiments, the electrical component 11 is an active component, for example, a chip or a semiconductor die. The electrical component 11 may be electrically connected to the substrate 10 by flip chip bonding, wire-bonding, or both.

The electrical component 12 is disposed on the top surface 101 of the substrate 10. In one or more embodiments, the electrical component 12 is a passive component, for example, a capacitor, a resistor, an inductor, or a combination of such components.

The stud-section 13 is disposed on the top surface 101 of the substrate 10.

Figure 1B:
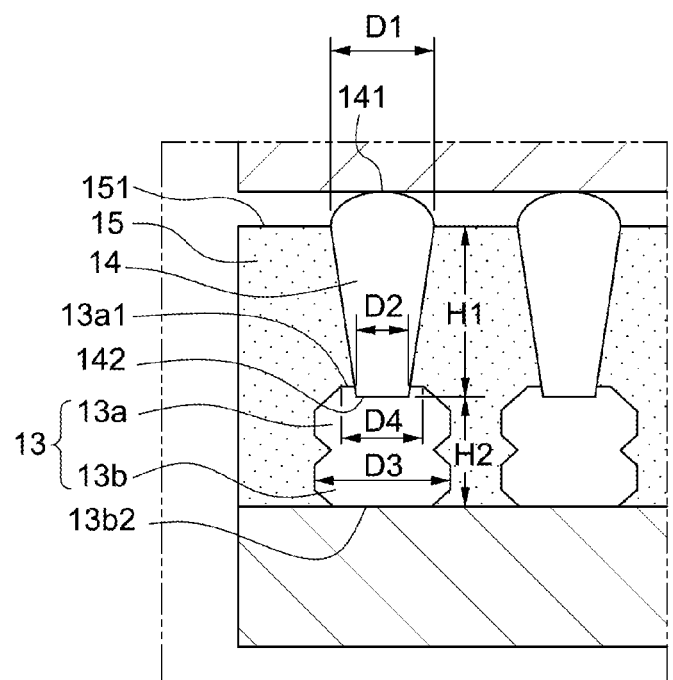
FIG. 1B illustrates a section of the semiconductor device package as shown in FIG. 1A.

FIG. 1B shows an enlarged view of the portion A encircled by dotted lines in FIG. 1A. As shown in FIG. 1B, the stud-section 13 includes two studs 13a, 13b. Two studs 13a, 13b are illustrated by way of example; in other embodiments, there may be more studs or fewer studs in the stud-section 13.

Referring to FIG. 1B, the electrical interconnection 14 is disposed at the top surface 13a1 of the stud-section 13. The electrical interconnection 14 is formed as a downward-tapering shape ("downward" in this context referring to the orientation illustrated in FIG. 1B, towards stud-section 13), and thus a width D1 of a top surface 141 of the electrical interconnection 14 is larger than a width D2 of a bottom surface 142 of the electrical interconnection 14.

A width D3 of each stud 13a, 13b is larger than the width D2 of the bottom surface 142 of the electrical interconnection 14. The width D2 of the bottom surface 142 of the electrical interconnection 14 is equal to or smaller than a width D4 of a top surface 13a1 of the stud-section 13, so that the electrical interconnection 14 does not extend over, extend into, or otherwise contact a side portion of the stud-section 13. In one or more embodiments, the width D3 of each stud 13a, 13b is greater than or equal to the width D1 of the top surface 141 of the electrical interconnection 14. In another embodiment, the width D3 of each stud 13a, 13b is smaller than the width D1 of the top surface 141 of the electrical interconnection 14. In one or more embodiments, the diameter D1 is approximately 80 μm to approximately 150 μm (e.g., approximately 80 μm to approximately 130 μm, approximately 80 μm to approximately 110 μm, or approximately 80 μm to approximately 90 μm). In one or more embodiments, the diameter D3 is approximately 80 μm to approximately 150 μm (e.g., approximately 80 μm to approximately 130 μm, approximately 80 μm to approximately 110 μm, or approximately 80 μm to approximately 90 μm).

Referring to FIG. 1B, the electrical interconnection 14 has a height H1 from the top surface 141 to the bottom surface 142. A height H2 is defined from the bottom surface 142 of the electrical interconnection 14 to a bottom surface 13b2 of the stud-section 13 (which is a bottom surface 13b2 of stud 13b in the embodiment illustrated in FIG. 1B). In one or more embodiments, the height H1 is approximately 180 μm to approximately 220 μm (e.g., approximately 180 μm to approximately 200 μm). In one or more embodiments, the height H2 is approximately 120 μm to approximately 180 μm (e.g., approximately 120 μm to approximately 140 μm, or approximately 120 μm to approximately 160 μm). In one or more embodiments, the height H1 is equal to or greater than the height H2. In one or more embodiments, the height H1 is equal to or greater than a height of any one stud in stud-section 13. In one or more embodiments, the height H1 is equal to or greater than a total height of the stud-section 13.

Referring back to FIG. 1A, the package body 15 is disposed on the top surface 101 of the substrate 10 to encapsulate the electrical components 11, 12, the stud-section 13 and a portion of the electrical interconnection 14. The top surface 141 of the electrical interconnection 14 is exposed from the package body 15. In one or more embodiments, the top surface 141 of the electrical interconnection 14 protrudes from a top surface 151 of the package body 15, such as, for example, where a protruding portion of the electrical interconnection 14 is from approximately 5% to approximately 50% of the height H1 (e.g., approximately 5% to approximately 30% or approximately 10% to approximately 30%. However, in other embodiments, the top surface 141 of the electrical interconnection 14 is substantially coplanar with, or lies below, the top surface 151 of the package body 15. The package body 15 may be, or may include, for example, an epoxy resin having fillers, a molding compound (e.g., an epoxy molding compound or other molding compound), a polyimide, a phenolic compound or material, a material with a silicone dispersed therein, or a combination thereof.

Referring still to FIG. 1A, the second module 1B includes a substrate 20, electrical components 21, 22 and a package body 25.

The substrate 20 is disposed on the first module 1A, and a bottom surface 202 of the substrate 20 is in electrical connection with the top surface 141 of the electrical interconnection 14. The substrate 20 may include an RDL or traces; for example, for electrical connection between components (e.g., the electrical components 21, 22) mounted on a top surface 201 of the substrate 20, or for electrical connection between components on the top surface 201 of the substrate 20 and electrical terminals on the bottom surface 202 of the substrate 20.

The electrical component 21 is disposed on the top surface 201 of the substrate 20. In one or more embodiments, the electrical component 21 is an active component, for example, a chip or a semiconductor die. The electrical component 21 may be electrically connected to the substrate 20 by flip chip bonding, wire-bonding, or both.

The electrical component 22 is disposed on the top surface 201 of the substrate 20. In one or more embodiments, the electrical component 22 is a passive component, for example, a capacitor, a resistor, an inductor, or a combination of such components.

In the embodiment of FIG. 1A, the first module 1A is electrically connected to the second module 1B by way of the stud-section 13 and the electrical interconnection 14. In other embodiments, the first module 1A is electrically interconnected to the second module 1B by a vertical interconnection of solder balls rather than through the stud-section 13 and the electrical interconnection 14. However, a diameter of solder balls (e.g., 250 μm) and a pitch between solder balls (e.g., 500 μm) results in a density of the components (e.g., components 11, 12, 21 and 22) being reduced, and a total size of a corresponding semiconductor device package being increased, relative to the embodiment illustrated in FIG. 1A. By way of comparison, as noted above, each of the stud-sections 13 and the electrical interconnections 14 may have a diameter of approximately 80 μm to approximately 150 μm. Further, a pitch between neighboring stud-sections 13 or neighboring electrical interconnections 14 is equal to or less than approximately 230 μm. Therefore, a total size of the semiconductor device package 1 of FIG. 1A may be reduced as compared to a device package using solder balls, and the manufacturing costs may correspondingly be reduced as well.

In other embodiments, the first module 1A is electrically interconnected to the second module 1B by a vertical interconnection using copper pillars rather than through the stud-section 13 and the electrical interconnection 14. In other embodiments, the first module 1A is electrically interconnected to the second module 1B by a vertical interconnection using stacked studs (e.g., stud-section 13) without the electrical interconnections 14. However, manufacturing processes impose a height limitation on copper pillars, and a number of studs that may be stacked may be limited by sway. The combination of the stud-section 13 and the electrical interconnection 14 as a vertical interconnection between the first module 1A and the second module 1B as shown in FIG. 1A allows for an increase in the total height of the vertical interconnection as compared to using a copper pillar or stacked studs. Therefore, taller components may be mounted on the substrate 10 of the first module 1A.

Referring still to FIG. 1A, package body 25 is disposed on the top surface 201 of the substrate 20 to encapsulate the electrical components 21, 22. The package body 25 may be, or may include, for example, an epoxy resin having fillers, a molding compound (e.g., an epoxy molding compound or other molding compound), a polyimide, a phenolic compound or material, a material with a silicone dispersed therein, or a combination thereof.

Figure 1C:
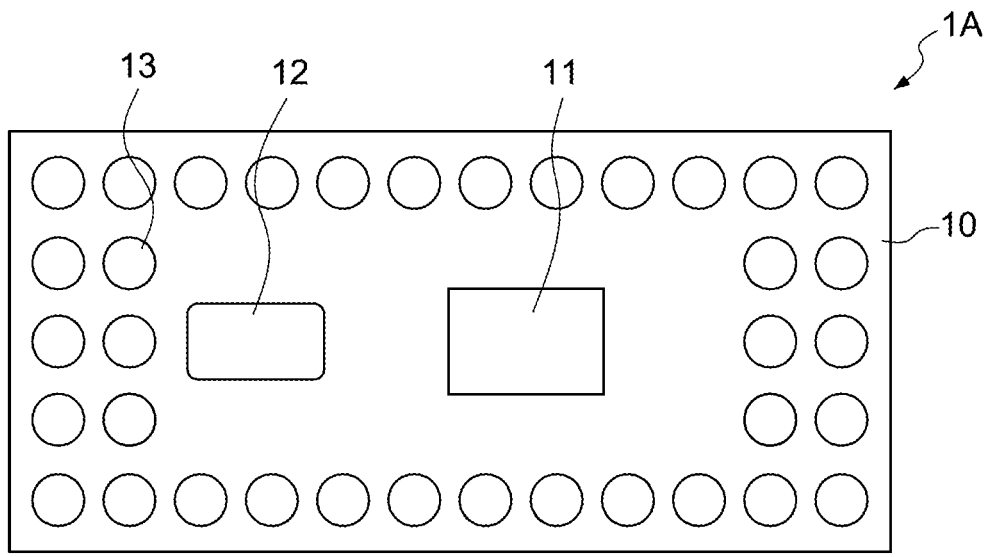
FIG. 1C illustrates a bottom view of a portion of the semiconductor device package shown in FIG. 1A in accordance with an embodiment of the present disclosure.

FIG. 1C illustrates a bottom view of the first module 1A of the semiconductor device package 1, from a plane along the bottom of the package body 15 where the package body 15 meets the top surface 101 of the substrate 10, in accordance with an embodiment of the present disclosure.

Referring to FIG. 1C, in one or more embodiments, the stud-sections 13 (and electrical interconnections 14 not visible in this view) are arranged around a peripheral edge of substrate 10, and also from the peripheral edge towards the electrical components 11 and 12.

The fine pitch and small diameter of the stud-sections 13 and the corresponding electrical interconnections 14 provide connection points for more input/output (I/O) connections within the first module 1A than would otherwise be available using solder balls or other forms of interconnection, and therefore may provide more flexibility for circuit design of the first module 1A.

The fine pitch and small diameter of the stud-sections 13 and electrical interconnections 14 allow the semiconductor device package 1 to include more interconnections between the first module 1A and the second module 1B than would otherwise be available using solder balls or other forms of interconnection. For example, ground paths may be added to surround signal nodes or paths, while maintaining a relatively small semiconductor device package 1. Additional ground paths around a signal node or path may reduce electrical interference introduced to the signal node or path such as crosstalk, coupling effect or electromagnetic interference (EMI), and thus may provide for improved performance. Some non-limiting examples of the use of ground paths are provided with respect to FIGS. 2A-2D, with some experimental results provided in FIG. 2E.

FIG. 2A, FIG. 2B, FIG. 2C and FIG. 2D illustrate different arrangements of interconnections (e.g., the combination of the stud-sections 13 and the electrical interconnections 14) labeled S1, S2, and G, where interconnections S1 and S2 refer to signal path interconnections, and interconnection G refers to a ground path interconnection.

Figure 2A:
FIG. 2A illustrates an arrangement of interconnections in accordance with an embodiment of the present disclosure.

In FIG. 2A, an interconnection S1 is disposed next to another interconnection S2. Interconnections S1 and S2 may be used to transmit the same or different signals. The arrangement as shown in FIG. 2A is referred to type 1 hereafter.

Figure 2B:
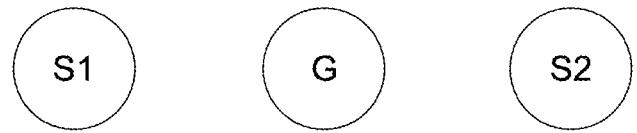
FIG. 2B illustrates an arrangement of interconnections in accordance with another embodiment of the present disclosure.

In FIG. 2B, a ground interconnection G is disposed between two signal interconnections S1, S2. In other words, the ground interconnection G is interposed between two signal interconnections S1, S2. The arrangement as shown in FIG. 2B is referred to type 2 hereafter.

Figure 2C:
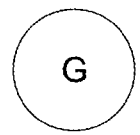
FIG. 2C illustrates an arrangement of interconnections in accordance with another embodiment of the present disclosure.
Figure 2C:
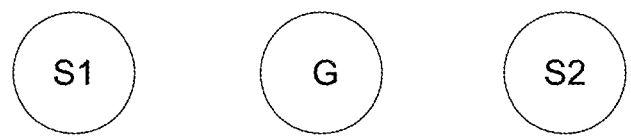
Figure 2C:
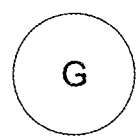

In FIG. 2C, three ground interconnections G are arranged around a signal interconnection S1. In other words, the signal interconnection S1 is surrounded by three ground interconnections G. The arrangement as shown in FIG. 2C is referred to type 3 hereafter.

Figure 2D:
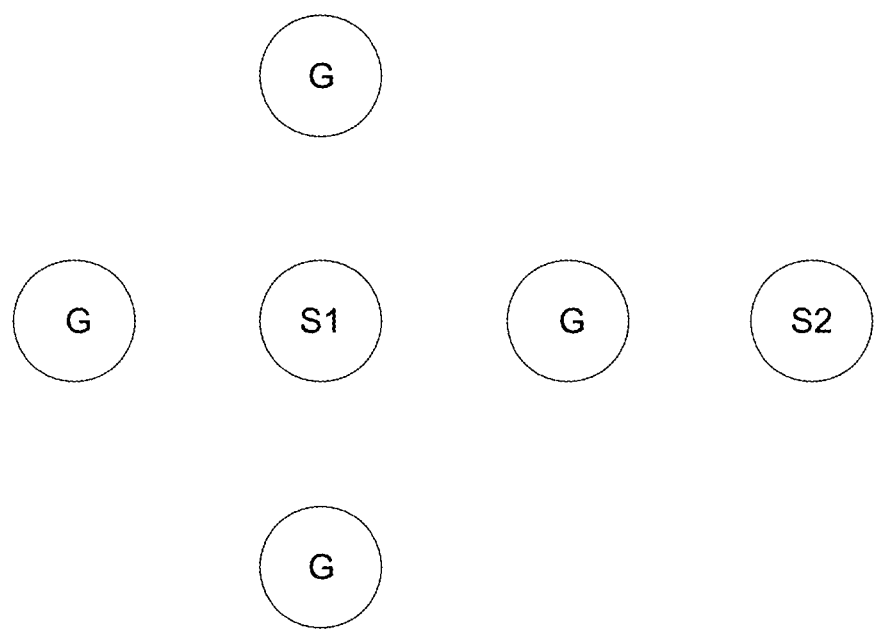
FIG. 2D illustrates an arrangement of interconnections in accordance with another embodiment of the present disclosure.

In FIG. 2D, four ground interconnections G are arranged around a signal interconnection S1. In other words, the signal interconnection S1 is surrounded by four ground interconnections G. The arrangement as shown in FIG. 2D is referred to type 4 hereafter.

Figure 2E:
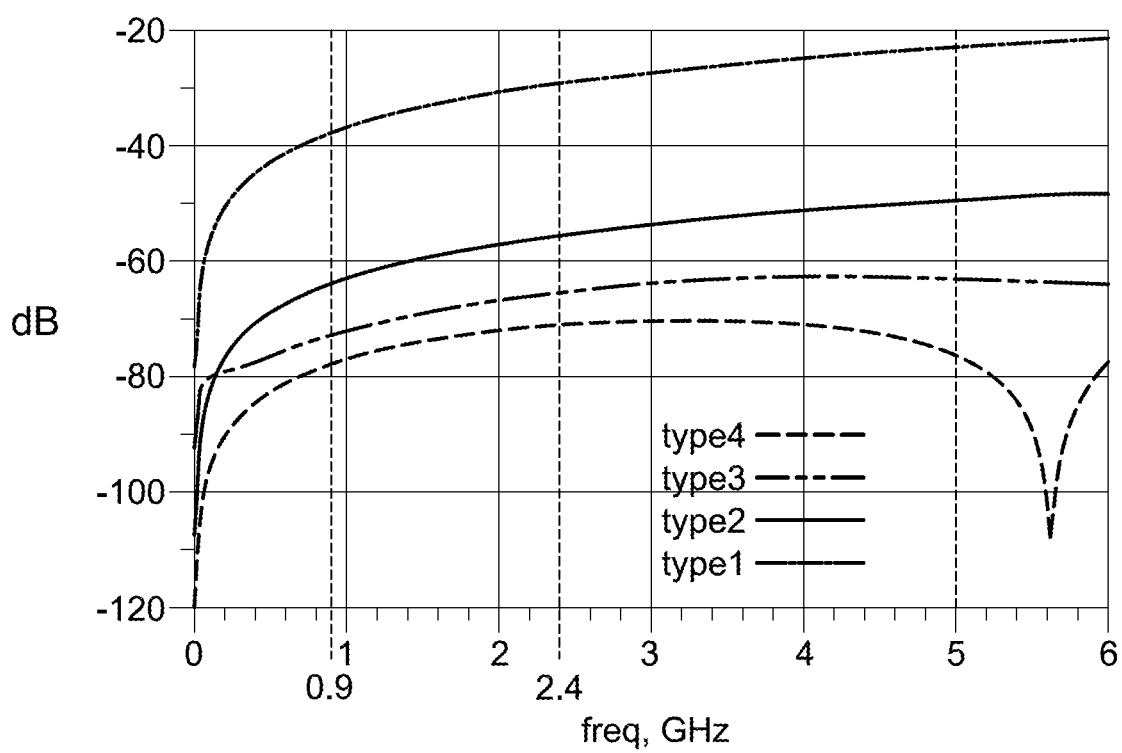
FIG. 2E illustrates experimental results in accordance with an embodiment of the present disclosure.

FIG. 2E illustrates experimental results of the coupling effect of types 1, 2, 3 and 4. In FIG. 2E, the x-axis represents frequencies (GHz) of the signal transmitted through the interconnections S1, S2; the y-axis represents the isolation value (dB) between the interconnections S1 and S2.

As shown in FIG. 2E, when the semiconductor device package 1 is operated at a frequency of 0.9 GHz, the approximate isolation values of type 1, type 2, type 3 and type 4 are −37.6 dB, −63.8 dB, −72.8 dB and −77.7 dB, respectively. When the semiconductor device package 1 is operated at a frequency of 2.4 GHz, the approximate isolation values of type 1, type 2, type 3 and type 4 are −29.1 dB, −55.4 dB, −65.3 dB and −70.9 dB, respectively. When the semiconductor device package 1 is operated at a frequency of 5 GHz, the approximate isolation values of type 1, type 2, type 3 and type 4 are −22.8 dB, −50.5 dB, −63.0 dB and −76.3 dB, respectively.

The experimental results in FIG. 2E show that more ground interconnections G surrounding the signal interconnection S1 may result in better isolation between the signal interconnections S1 and S2.

Because of the smaller diameter and pitch of the stud-sections 13 and electrical interconnections 14, more ground paths may be arranged in the semiconductor device package 1 as compared to other types of vertical interconnections, so as to surround one or more signal nodes or paths for better isolation. Accordingly, the performance of the semiconductor device package 1 may be improved.

FIGS. 3A-3F illustrate a semiconductor manufacturing process in accordance with an embodiment of the present disclosure.

Figure 3A:
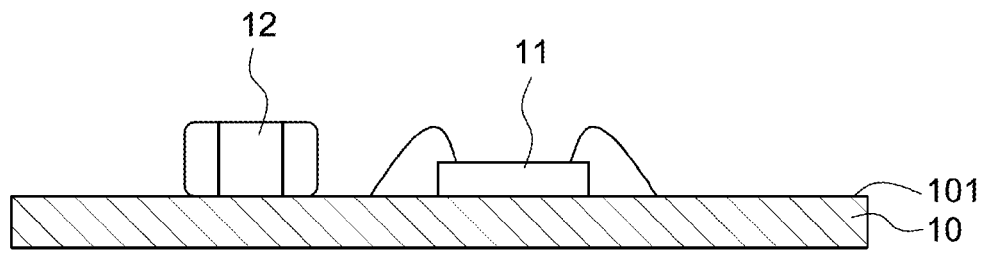
FIG. 3A, FIG. 3B, FIG. 3C, FIG. 3D, FIG. 3E and FIG. 3F illustrate a manufacturing process in accordance with an embodiment of the present disclosure.

Referring to FIG. 3A, a substrate 10 is provided. The substrate 10 is formed of, for example, a printed circuit board, such as a paper-based copper foil laminate, a composite copper foil laminate, or a polymer-impregnated glass-fiber-based copper foil laminate. Electrical components 11, 12 are placed on a top surface 101 of the substrate 10. The substrate 10 may include an RDL or traces; for example, for electrical connection between components (e.g., the electrical components 11, 12) mounted on the top surface 101 of the substrate 10, or for other electrical connections.

Figure 3B:
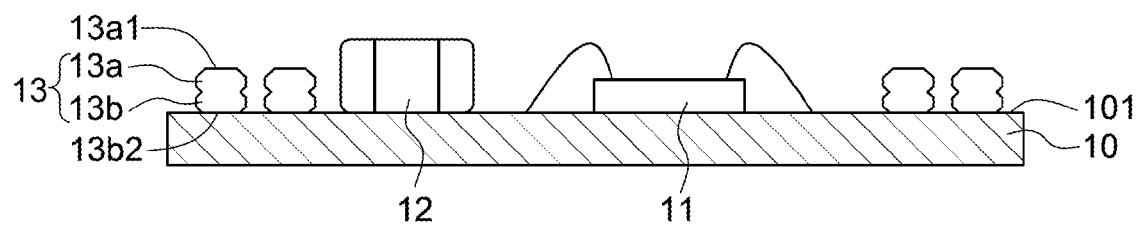

Referring to FIG. 3B, stud-sections 13 are placed on the top surface 101 of the substrate, using for example, a wire-bonding technique. More particularly, each stud-section 13 is formed by placing a stud 13b on the substrate 10 and then stacking another stud 13a on the stud 13b. As noted above, there may be more than or fewer than two studs in a stud-section 13, and the number of stacked studs is determined based on a desired vertical height for the stud-section 13. Further, different ones of the stud-sections 13 my include different numbers of studs. In one or more embodiments, the studs 13a, 13b may be, or may include, a conductive material such as gold, copper, aluminum or other suitable conductive material.

Figure 3C:
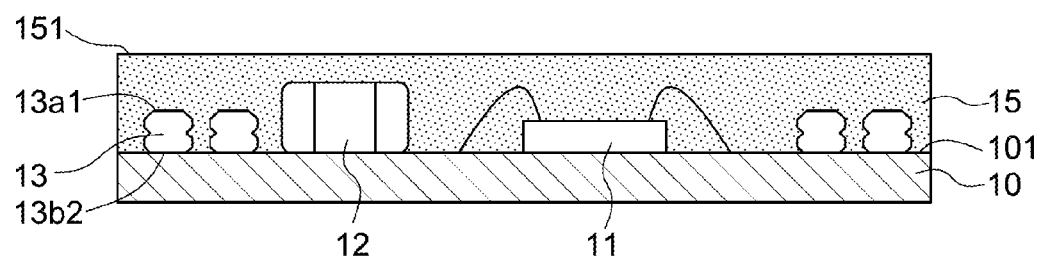

Referring to FIG. 3C, a package body 15 is formed on the top surface 101 of the substrate 10 to encapsulate the electrical components 11, 12 and the stud-sections 13. The package body 15 may be formed by a molding technique, such as transfer molding or compression molding.

Figure 3D:
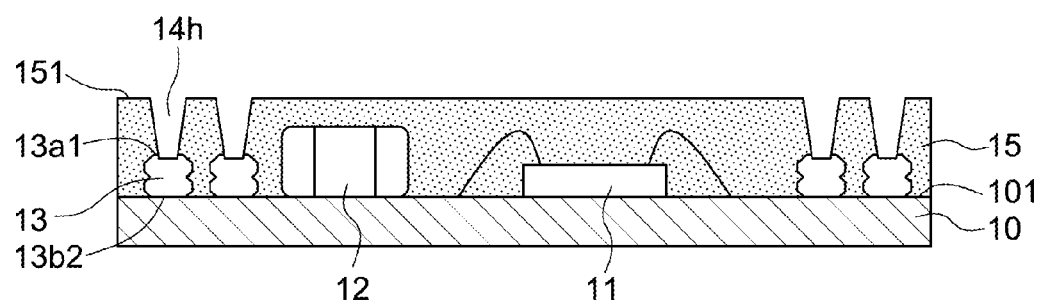

Referring to FIG. 3D, a number of openings 14h are formed in the package body 15 to expose at least a portion of a top surface 13a1 of each stud-section 13. Each opening 14h tapers in a direction from a top surface 151 of the package body towards the top surface 13a1 of the stud-section 13, so that the opening 14h is downward-tapered in shape (in the orientation of FIG. 3D). The opening 14h may be formed, for example, by laser drilling or by etching techniques.

Figure 3E:
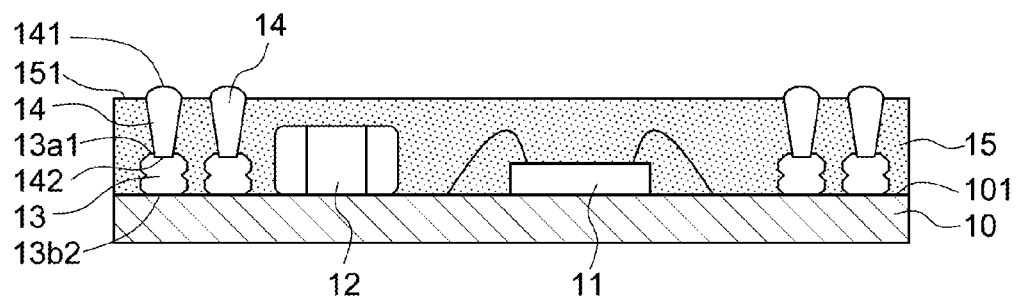

Referring to FIG. 3E, an electrically conductive material is filled into each opening 14h to form electrical interconnections 14. In one or more embodiments, the electrically conductive material may be, or may include, for example, tin, and may be formed by injecting, sputtering or printing. In one or more embodiments, the electrical interconnections 14 are formed to slightly protrude from the top surface 151 of the package body 15.

Then, a reflow process is performed to form a metallic interconnect phase between each electrical interconnection 14 and a corresponding stud-section 13, so as to form the first module 1A of the semiconductor device package 1 shown in FIG. 1A. After the reflow process, the electrical interconnections 14 may slightly protrude from the top surface 151 of the package body 15 as illustrated in FIG. 3E; however, in some embodiments, a top surface 141 of each electrical interconnection 14 may instead be substantially coplanar with, or may be lower than, the top surface 151 of the package body 15.

Figure 3F:
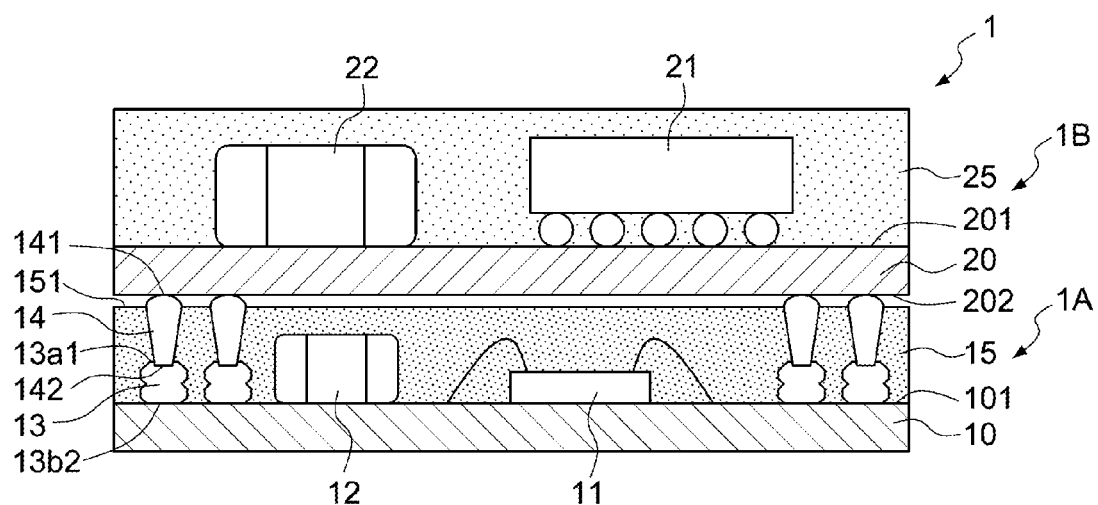

Referring to FIG. 3F, a second module 1B is mounted on the first module 1A, so as to form the semiconductor package 1 shown in FIG. 1A. Each electrical interconnection 14 electrically connects to a corresponding electrical terminal (not shown) of the second module B to form an electrical connection between the first module 1A and the second module 1B. Thus, signals may be transmitted between the first module 1A and the second module 1B through the stud-sections 13 and the electrical interconnections 14, and vice versa.

The process of manufacturing the second module 1B is similar to that of manufacturing the first module 1A, and thus will not be described. In one or more embodiments, the processes described with respect to FIGS. 3D and 3E may be omitted for the second module 1B, as illustrated in FIG. 3F; namely, forming openings in the package body 25 and filling the holes with electrically conductive material may be omitted. It is to be understood that more than two modules (e.g., more than the first module 1A and the second module 1B) may be stacked, and therefore the second module 1B may also include openings in the package body 25 filled by electrically conductive material.

As used herein, the terms "substantially," "substantial," "approximately," and "about" are used to denote small variations. When used in conjunction with an event or circumstance, the terms can refer to instances in which the event or circumstance occurs precisely, as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm Additionally, amounts, ratios, and other numerical values are sometimes presented herein in a range format. It can be understood that such range formats are used for convenience and brevity, and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a first substrate having a top surface;
    a first set of electrical components disposed on the top surface of the first substrate;
    at least one stud having a top surface and a bottom surface, the bottom surface of the stud disposed on the top surface of the first substrate;
    a tapering electrical interconnection having a top surface and a bottom surface, the bottom surface of the electrical interconnection being disposed at the top surface of the stud, a width of the stud is greater than or equal to a width of the bottom surface of the electrical interconnection; and
    a first package body disposed on the top surface of the first substrate, encapsulating the first set of electrical components, the stud and a portion of the electrical interconnection, the first package body exposing the top surface of the electrical interconnection.

2. The semiconductor device package of claim 1, wherein the width of the bottom surface of the electrical interconnection is equal to or smaller than a width of the top surface of the stud.

3. The semiconductor device package of claim 1, wherein a height of the electrical interconnection is equal to or greater than a height of the one stud.

4. The semiconductor device package of claim 1, wherein the top surface of the electrical interconnection protrudes from a top surface of the first package body.

5. The semiconductor device package of claim 1, wherein the at least one stud is a plurality of stacked studs.

6. The semiconductor device package of claim 1, further comprising:
    a second substrate having a top surface and a bottom surface, the bottom surface of the second substrate disposed on a top surface of the first package body;
    a second set of electrical components disposed on the top surface of the second substrate; and a second package body disposed on the top surface of the second substrate and encapsulating the second set of electrical components.

7. A semiconductor device package, comprising:
a first substrate having a top surface;
a first stud-section having a top surface and a bottom surface, the bottom surface of the first stud-section disposed on the top surface of the first substrate;
an electrical interconnection having a top surface and a bottom surface, the electrical interconnection tapering from the top surface of the electrical interconnection to the bottom surface of the electrical interconnection, the bottom surface of the electrical interconnection disposed at the top surface of the first stud-section, wherein a height of the electrical interconnection is equal to or greater than a height of the first stud-section; and
a first package body disposed on the top surface of the first substrate, the first package body covering the first stud-section and a portion of the electrical interconnection, and the first package body exposing the top surface of the electrical interconnection.

8. The semiconductor device package of claim 7, wherein a width of the bottom surface of the electrical interconnection is equal to or less than a width of the top surface of the first stud-section.

9. The semiconductor device package of claim 7, wherein a width of the top surface of the electrical interconnection is equal to or less than a width of the first stud-section.

10. The semiconductor device package of claim 7, wherein the top surface of the electrical interconnection protrudes from a top surface of the first package body.

11. The semiconductor device package of claim 7, further comprising:
a second substrate having a top surface and a bottom surface, the bottom surface of the second substrate disposed on a top surface of the first package body; and
a second package body disposed on the top surface of the second substrate.

12. The semiconductor device package of claim 11, wherein the first stud-section includes a plurality of stacked studs.

13. The semiconductor device package of claim 7, further comprising a second stud-section disposed on the top surface of the first substrate and adjacent to the first stud-section, wherein the second stud-section is grounded.

14. The semiconductor device package of claim 13, wherein the first stud-section is configured to provide a signal path, further comprising a third stud-section disposed on the top surface of the first substrate and configured to provide another signal path, wherein the second stud-section is disposed between the first stud-section and the third stud-section.

* * * * *